United States Patent
Borjesson

(10) Patent No.: US 11,159,159 B1
(45) Date of Patent: Oct. 26, 2021

(54) ELECTROPLATING CONTROLLER WITH POWER BASED HEAD-ROOM CONTROL

(71) Applicant: Applied Materials, Inc., Santa Clara, CA (US)

(72) Inventor: Mikael R. Borjesson, Lakeside, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/015,612

(22) Filed: Sep. 9, 2020

(51) Int. Cl.
| | |
|---|---|
| *H02M 3/156* | (2006.01) |
| *H02M 3/158* | (2006.01) |
| *H02M 3/335* | (2006.01) |
| *G05F 1/565* | (2006.01) |
| *G05F 1/575* | (2006.01) |
| *C25D 21/12* | (2006.01) |
| *H03K 17/687* | (2006.01) |
| *H03F 3/45* | (2006.01) |

(52) U.S. Cl.
CPC ........... *H03K 17/687* (2013.01); *C25D 21/12* (2013.01); *H03F 3/45475* (2013.01)

(58) Field of Classification Search
None
See application file for complete search history.

(56) References Cited

U.S. PATENT DOCUMENTS

| | | | |
|---|---|---|---|
| 8,866,547 B2* | 10/2014 | Mathe | H03F 3/245 330/127 |
| 9,748,734 B1* | 8/2017 | Stiffler | H01S 3/0941 |
| 9,886,048 B2* | 2/2018 | Du | G05F 1/575 |
| 10,185,342 B2* | 1/2019 | Melgar | H02M 3/1582 |
| 10,269,307 B2* | 4/2019 | Xie | H05B 45/347 |
| 10,309,031 B2 | 6/2019 | Cummings et al. | |

* cited by examiner

*Primary Examiner* — Kenneth B Wells
(74) *Attorney, Agent, or Firm* — Kilpatrick Townsend & Stockton LLP

(57) ABSTRACT

A method of controlling a headroom voltage of a transistor stage of an electroplating system to maintain a target power dissipation across the transistor stage may include maintaining a headroom voltage in the transistor stage for a load in the electroplating system. The method may also include measuring an instantaneous power dissipation in the transistor stage and generating a difference output representing a difference between the instantaneous power dissipation in the transistor stage and the target power dissipation in the transistor stage. A voltage across the transistor stage and the load may then be adjusted using the difference output such that the headroom voltage in the transistor stage is adjusted to maintain the target power dissipation in the transistor stage.

20 Claims, 10 Drawing Sheets

ELECTROPLATING CONTROLLER WITH POWER BASED HEAD-ROOM CONTROL

TECHNICAL FIELD

The present technology relates to cleaning operations in semiconductor processing. More specifically, the present technology relates to systems and methods that control voltages or currents in electroplating systems.

BACKGROUND

Integrated circuits are made possible by processes that produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may waste expensive substrates or wafers.

During formation of metal materials on a wafer or a substrate, a substrate may be submerged within a plating bath followed by metal formation on the substrate by an electroplating process. The wafer may be subsequently raised or otherwise moved and then rinsed at the chamber. Several issues may occur during this process. For example, current electroplating controllers may use a voltage controlled head room to manage the heating in the in a Metal Oxide Semiconductor Field Effect Transistor or (MOSFET) in a control circuit that governs voltage and current flow during the electroplating process. The resulting head room voltage is controlled to the same value regardless of power dissipated in the MOSFET. This creates a dependency in the response rate of the variable voltage source used to generate a rail voltage supplied to the current or voltage of the electroplating system.

Thus, there is a need for improved systems and methods that can be used to more efficiently control the head room voltage in an electroplating controller. These and other needs are addressed by the present technology.

BRIEF SUMMARY

In some embodiments, a circuit for controlling a headroom voltage of a transistor stage of an electroplating system to maintain a target power dissipation across the transistor stage may include a transistor stage that provides a headroom voltage for a load in an electroplating system. The circuit may also include a power-measurement circuit coupled to the transistor stage. The power-measurement circuit may provide a signal representative of an instantaneous power dissipation in the transistor stage. The circuit may additionally include a difference circuit that receives the signal representative of the instantaneous power dissipation in the transistor stage from the power-measurement circuit and receives a signal representative of the target power dissipation in the transistor stage to generate a difference output. The circuit may further include an adjustable voltage source that provides a voltage across the transistor stage and the load. The adjustable voltage source may be configured to use the difference output to adjust the headroom voltage to maintain the target power dissipation in the transistor stage.

In some embodiments, a method of controlling a headroom voltage of a transistor stage of an electroplating system to maintain a target power dissipation across the transistor stage may include maintaining a headroom voltage in the transistor stage for a load in the electroplating system and measuring an instantaneous power dissipation in the transistor stage. The method may also include generating a difference output representing a difference between the instantaneous power dissipation in the transistor stage and the target power dissipation in the transistor stage. The method may further include adjusting a voltage across the transistor stage and the load using the difference output such that the headroom voltage in the transistor stage is adjusted to maintain the target power dissipation in the transistor stage.

In some embodiments, a circuit for controlling a headroom voltage of a transistor stage to maintain a target power dissipation across the transistor stage may include a transistor stage that provides a headroom voltage for a load. The circuit may also include a power-measurement circuit coupled to the transistor stage. The power-measurement circuit may provide a signal representative of an instantaneous power dissipation in the transistor stage. The circuit may additionally include an adjustable voltage source that provides a voltage across the transistor stage and a load. The adjustable voltage source may be configured to adjust the headroom voltage in the transistor stage in response to the instantaneous power dissipation in the transistor stage to maintain the target power dissipation in the transistor stage.

In any embodiments, any and/or all of the following features may be implemented in any combination and without limitation. Other features described in this disclosure may also be added in any embodiment in any combination and without limitation. The power-measurement circuit may include a voltage measurement circuit coupled to the transistor stage to provide a measurement representing a voltage across the transistor stage. The power-measurement circuit may also include a current measurement circuit coupled to the transistor stage to provide a measurement representing a current through the transistor stage. The power-measurement circuit may also include a multiplier circuit that receives the measurement representing the voltage across the transistor stage and the measurement representing the current through the transistor stage to generate the signal representative of an instantaneous power dissipation in the transistor stage. The difference circuit may include an operational amplifier that provides an output to an AC-to-DC converter. The circuit may include a difference amplifier that receives a signal representing a target current though the transistor stage and receives an instantaneous current through the transistor stage. The difference amplifier may provide a gate voltage to the transistor stage to achieve the target current through the transistor stage. The signal representative of the instantaneous power dissipation in the transistor stage may include a voltage that is proportional to the instantaneous power dissipation. The method/operations may also include determining a voltage across the transistor stage and/or determining a current through the transistor stage. The method/operations may also include multiplying a signal representative of a voltage across the transistor stage with a signal representative of a current through the transistor stage to determine the instantaneous power dissipation in the transistor stage. The method/operations may also include reducing the headroom voltage in the transistor stage as a current through the transistor stage increases. The method/operations may also include scaling down a signal representative of the instantaneous power dissipation in the transistor stage. The method/operations may also include generating a transition in the voltage across the transistor stage and the load having less than a 10 ms fall time. The target power dissipation may be represented by a plurality of series resistors forming a voltage divider. The adjustable voltage source may include a AC-to-DC power converter. The power-measurement circuit may be implemented using a microprocessor or microcontroller. The circuit may also include a serial interface that receives serial commands from a controller and translates the serial commands into a plurality of analog and digital signals to control the circuit for controlling the headroom voltage of the transistor stage.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
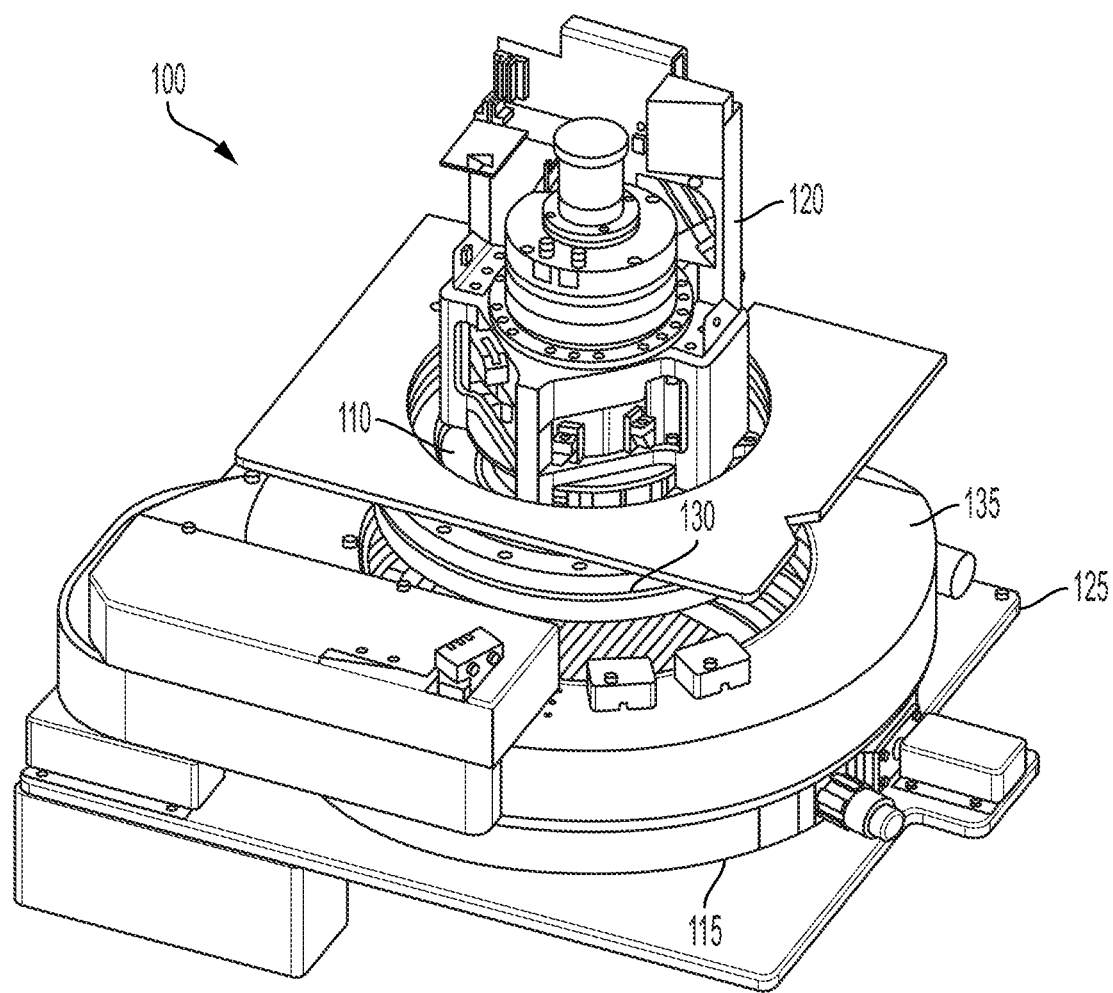
FIG. 1 illustrates a schematic isometric view of an electroplating system for which methods and cleaning systems may be utilized and practiced according to embodiments.

Electroplating is a process in which an electrical current or voltage signal is used to control deposition of a metal or metallic compound on a surface of a substrate. Electroplating is used in many applications, including, for example, fabrication of integrated circuits. In such applications, precise control of the metal deposition rates and geometries is desirable. This requires accurately controlling electroplating current, especially as microelectronic components on semiconductor substrate components continue to become smaller.

Electroplating current may be advantageously controlled digitally, or via a programmable controller. A programmable output may be used to optimize the plating rate. Semiconductor fabrication equipment may be used to manufacture various products. A programmable controller allows the equipment to be readily used to electroplate different products. Fabrication equipment have two or more anodes, a cathode connected to the wafer or substrate, and optionally a thief electrode. The programmable controller in this equipment simultaneously controls multiple channels, presenting a further engineering challenge.

Electroplating equipment may also preferably have the capability to accurately control an output current having a high dynamic range. An electroplating system often is expected to provide a wide range of output current to provide effective control of the electroplating. The currents required for plating processes may vary over a wide range, between a few milliamps to tens of amps, for example.

Electroplating operations may be performed to provide conductive material into vias and other features on a substrate. Electroplating utilizes an electrolyte bath containing ions of the conductive material to electrochemically deposit the conductive material onto the substrate and into the features defined on the substrate. The substrate on which metal is being plated operates as the cathode. An electrical contact, such as a ring or pins, may allow the current to flow through the system. During electroplating, a substrate may be clamped to a head and submerged in the electroplating bath to form the metallization. In systems as described below, the substrate may also be chucked within a seal that may be coupled with the head during processing. When the substrate is moved or raised after plating, it may be rinsed with water, such as deionized water, prior to being sent to another plating chamber or some other processing location.

The voltage and/or current provided to the electroplating process may be controlled by a digital controller. This controller may provide a variable voltage source across the electroplating load and a control transistor in series. A headroom voltage may be maintained on the transistor stage to provide a voltage buffer to accommodate abrupt changes in the voltage profile across the load. Conventional technologies may use a constant headroom voltage that is maintained as the voltage across the load is changed. However, these technologies limit the speed with which the voltage/current across the load can change. Rise times and fall times are on the order of 100 ms, and often generate discontinuities in the output. Other technologies may use a very large voltage headroom to accommodate faster rise times. However, these technologies result in very high power dissipation in the form of heat in the control system.

The present technology overcomes these issues by using a dynamic headroom voltage. Instead of maintaining a constant headroom voltage, these technologies may maintain a target power dissipation level in the transistor stage. When the current is very small during the initial stage of the electroplating process, the headroom voltage may be very large. This large headroom voltage may accommodate very fast rise times. As the current through the transistor stage increases, the headroom voltage may be reduced to maintain a constant power dissipation level. These technologies balance power dissipation with maintaining a sufficient headroom voltage to achieve rise times and/or fall times on the order of 1 ms.

FIG. 1 illustrates a schematic isometric view of an electroplating system 100 for which methods and cleaning systems may be utilized and practiced according to embodiments. The electroplating system 100 may include a system head 110 and a bowl 115. During electroplating operations, a wafer may be clamped to the system head 110, inverted, and extended into bowl 115 to perform an electroplating operation. The electroplating system 100 may include a head lifter 120, which may be configured to both raise and rotate the system head 110, or to otherwise move or position the head within the system including tilting operations. The head and bowl may be attached to a deck plate 125 or other structure that may be part of a larger system incorporating multiple electroplating systems 100, and which may share an electrolyte, a voltage control system, and/or other materials.

A rotor may allow a substrate clamped to the head to be rotated within the bowl, or outside the bowl in different operations. The rotor may include a contact ring, which may provide a conductive contact with the substrate. A seal 130 may be connected with the system head 110. The seal 130 may include a chucked wafer to be processed. FIG. 1 illustrates an electroplating system 100 that may include components to be cleaned directly on the platform. Other configurations are possible, including platforms on which the system head 110 is moved to an additional module and the seal 130 or other components are cleaned. Additionally, one or more components, such as the seal 130 may be removed from a respective chamber and placed in a maintenance system or cleaning system for cleaning. Any number of other operations may be performed that provide or expose a component for cleaning. An exemplary in situ rinse system 135 is also illustrated with the system 100.

Figure 2:
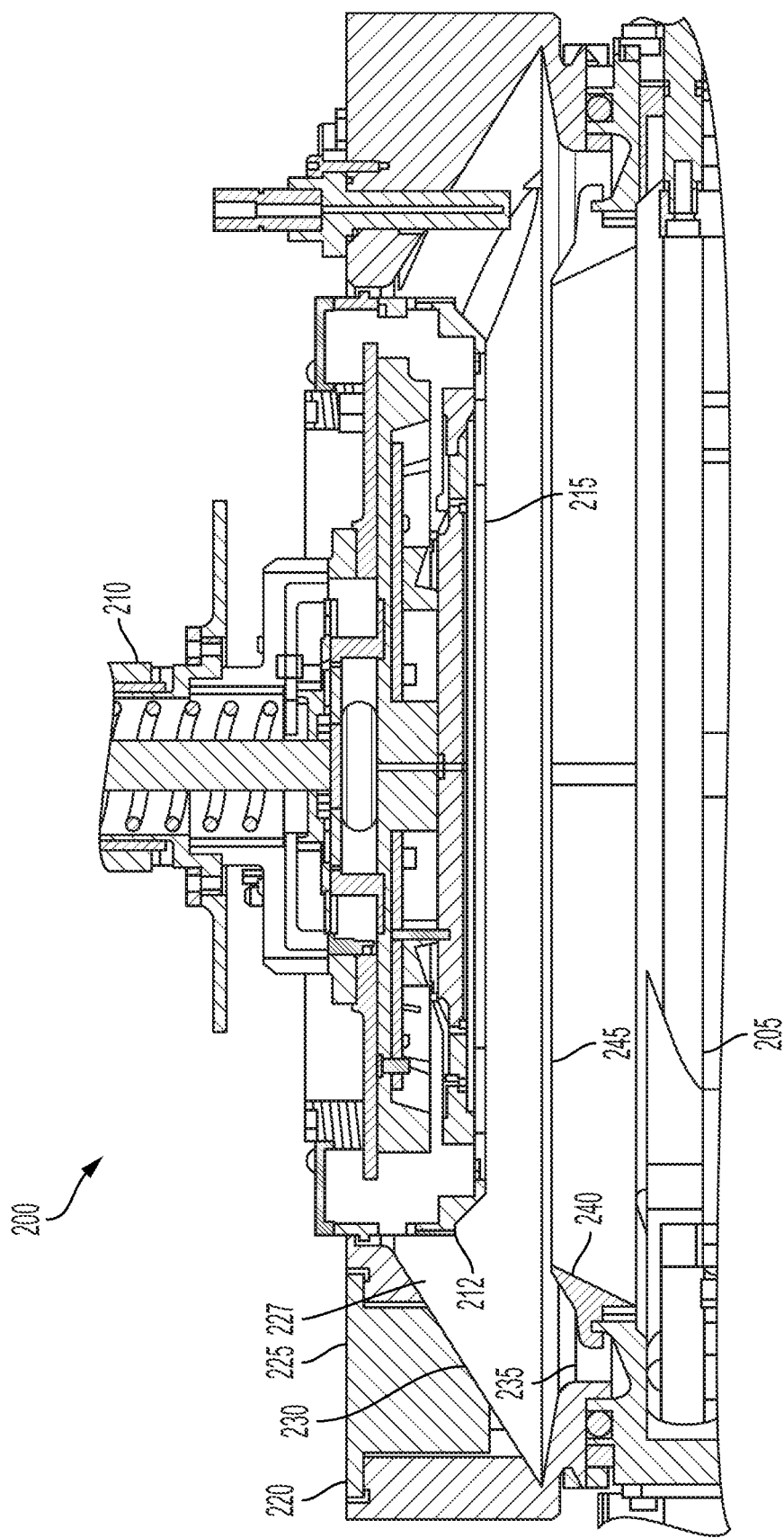
FIG. 2 illustrates a partial cross-sectional view of a chamber including aspects of an electroplating apparatus, according to some embodiments.

FIG. 2 illustrates a partial cross-sectional view of a chamber including aspects of an electroplating apparatus 200, according to some embodiments. The electroplating apparatus 200 may be incorporated with an electroplating system, including the electroplating system 100 described above. As illustrated in FIG. 2, a plating bath vessel 205 of an electroplating system is shown along with a head 210 having a substrate 215 coupled with the head 210. The substrate may be coupled with a seal 212 incorporated on the head 210 in some embodiments. A rinsing frame 220 may be coupled above the plating bath vessel 205 and may be configured to receive the head 210 into the plating bath vessel 205 during plating. The rinsing frame 220 may include a rim 225 extending circumferentially about an upper surface of the plating bath vessel 205. A rinsing channel 227 may be defined between the rim 225 and an upper surface of the plating bath vessel 205. For example, the rim 225 may include interior sidewalls 230 characterized by a sloping profile. As described above, rinse fluid from a substrate may contact the sidewalls 230 and may be received in a plenum 235 extending about the rim 225 for collection of the rinse fluid from the electroplating apparatus 200. A weir 240 may extend about the plating bath vessel 205 and may be fluidly coupled with the plenum 235 or rinsing channel 227 to further limit rinsing fluid from returning to the plating bath. The weir 240 may define a plane 245 across the electroplating apparatus 200, through which the head 210 may extend to enter the plating bath vessel 205, and through which the head 210 may return to perform a rinsing operation.

Figure 3:
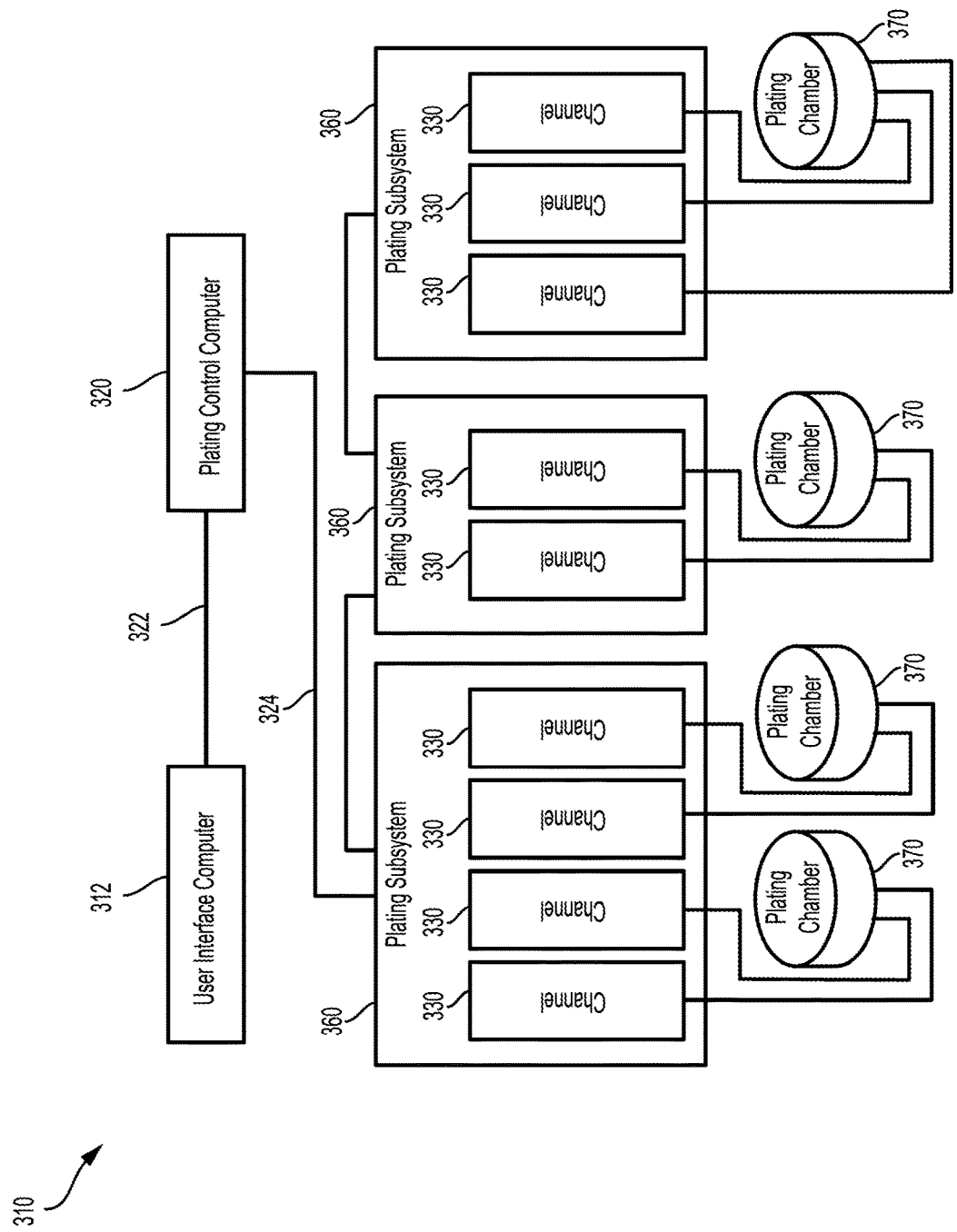
FIG. 3 illustrates an electroplating apparatus that may include a user interface computer, according to some embodiments.

FIG. 3 illustrates an electroplating apparatus that may include a user interface computer 312, according to some embodiments. The user interface computer 312 may be coupled with a plating control computer 320 using, for example an Ethernet interface 322. The Ethernet interface 322 may be used for equipment communications that are not as time-critical, such as communications to the user interface computer 312. A single plating control computer 320 may communicate with one or more plating subsystems 360 over, for example, an EtherCAT interface 324. Each of the one or more plating subsystems 360 may control one or more anodes in a plating chamber.

Each plating subsystem 360 may have one or more channels 330, each of which may be connected to a zone in a plating chamber 370. Multiple plating chamber zones may be used to control radial plating uniformity on the substrate. For brevity, the plating subsystem 360 components are be referred to herein as a PPS (Plating Power Supply assembly). FIG. 3 shows three different sample PPS configurations. A first PPS configuration shows four channels, which are connected to support two plating chambers 370 using two channels per plating chamber. The second example shows a PPS configuration with two channels to support a single plating chamber. The third sample shows a PPS configuration with three channels to support a plating chamber with three channels per plating chamber.

Figure 4:
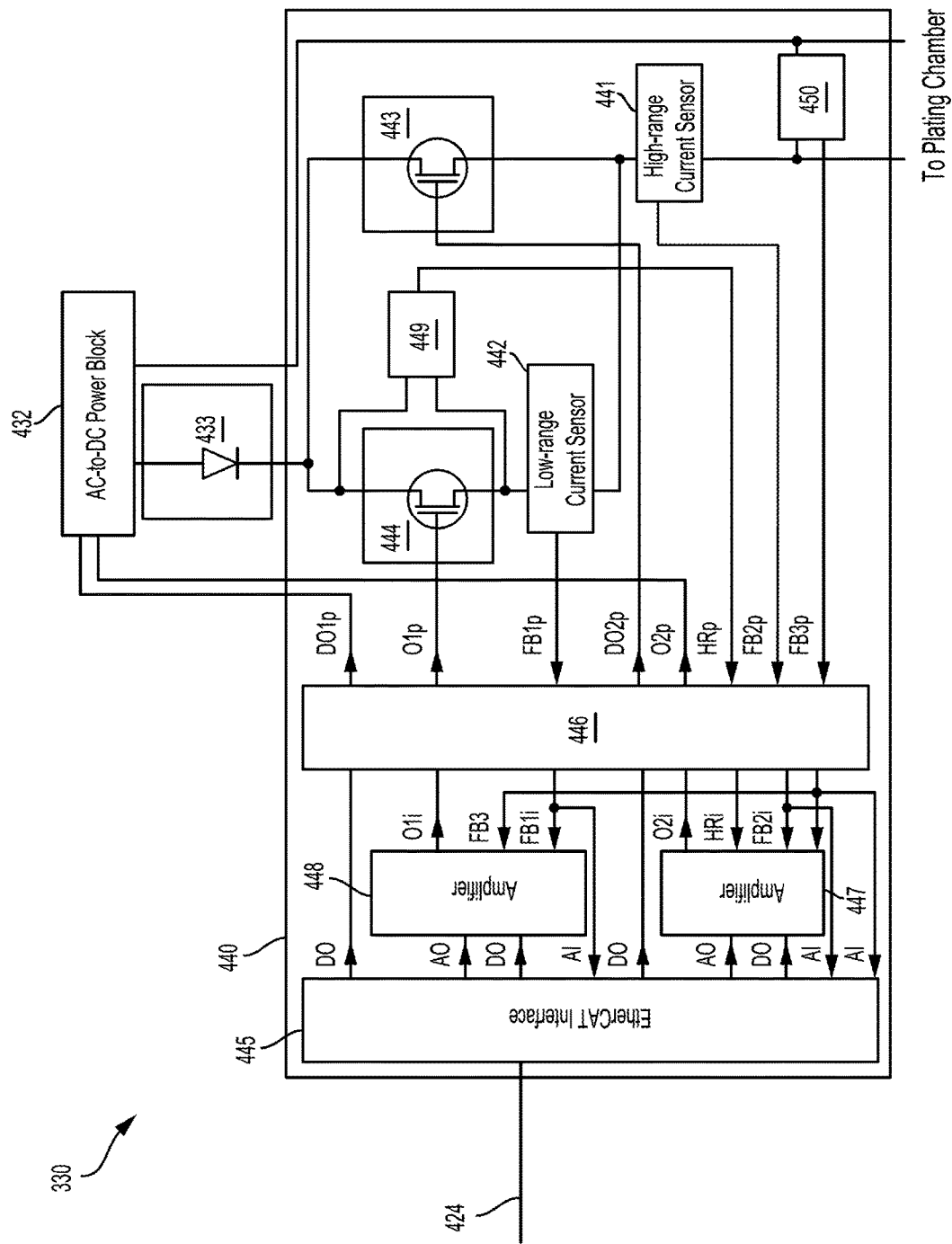
FIG. 4 illustrates a block diagram for one of the one or more plating channels illustrated in FIG. 3, according to some embodiments.

FIG. 4 illustrates a block diagram for one of the one or more plating channels 330 illustrated in FIG. 3, according to some embodiments. The plating channel 330 may be connected to a control board 440. The control board 440 may be coupled with more than one plating channel, although a connection to a single plating channel 330 is shown in isolation in FIG. 4 for the sake of clarity. The Control board 440 may include circuitry to interface between the AC-to-DC power block 432 and the EtherCAT interfaces 324. Operating the AC-to-DC power block 432 may include communicating control messages to control operation of the AC-to-DC power block 432 from the plating control computer 320 via the EtherCAT interface 324. The AC-to-DC power block 432 may include an AC-to-DC power converter. The control messages may include a digital control message that specifies whether the output electrical control signal is voltage or current, along with an analog control message that specifies the target output electrical control signal values and the corresponding durations.

The control board 440 may include one or more current sensors. In order to achieve a wider range of plating currents, a high-range current sensor 441 and a low-range current sensor 442 may be provided. However, in some embodiments, a single current sensor or more than two current sensors may be used without limitation to receive additional current measurements.

The control board 440 may also include one or more current switching elements 443 to route current through the high-range current sensor 441. The current switching elements 443 may include one or more MOSFETs controlled by a digital signal DO2p that turns the MOSFET(s) on hard for low power dissipation in the one or more current switching elements 443. The control board 440 may also include one or more current switching elements 444 to route current through the low-range current sensor 442. These one or more current switching elements 444 may be controlled by an analog output O1p and a control circuit that places the one or more current switching elements 444 in series with the AC-to-DC power block 432. In some embodiments, the one or more current switching elements 444 may function as a linear step-down regulator.

The control board 440 may also include EtherCAT digital and analog input and output circuitry in an I/O interface 445. Software running in the plating control computer 320 may control a corresponding plating subsystem 360 by turning on digital outputs, setting analog outputs to control the plating current or voltage set points, and reading back digital inputs and analog inputs to report and record plating process sensor measurements, such as current and voltage. The I/O interface 445 may be configured to distribute these analog and digital signals throughout the control board 440.

The control board 440 may also include isolation circuits 446. The optional isolation circuits 446 may be used to prevent electrical interaction between the electroplating power delivery circuits and the interface/control circuits. Additionally, the control board 440 may include op amp circuit 447 and/or op amp circuit 448 to provide closed loop control. For example, op amp circuit 447 may control the AC-to-DC power block 432. Op amp circuit 448 may control the one or more switching elements 444 that may include a low-range transistor. The AC-to-DC power block 432 typically may have an on/off control, which may be controlled by software running in the plating control computer 320 using a digital output DO1p.

The electroplating apparatus 310 may further include blocking diode(s) 433 to prevent interaction between the AC-to-DC power block 432 and other AC-to-DC power blocks in other channels when they are connected together in a plating chamber. For example, it may be desirable at times to simultaneously plate in some zones and de-plate in a different zone. If a zone is designed for de-plating, the diode 433 would be reversed, and the polarity of the voltage coming from the AC-to-DC power block 432 would be reversed.

To initiate an electroplating operation, an operator may enter the desired, or target, plating process into the user interface computer 412. This may include a desired mode (e.g., voltage or current), a desired set point (e.g., 2.5 A), and a desired duration (e.g., 1 min) to be used by a channel of the plating system. The entered process parameters may be sent to the plating control computer 320, which may control the time sensitive electroplating operations of the equipment.

Next, the semiconductor processing equipment may bring the substrate to the plating chamber 370 and immerse it in a plating solution, typically via a robot. Software in the plating control computer 320 may control the PPS 360 by sending EtherCAT commands to turn on digital and analog outputs in the PPS 360 to communicate the desired settings. The digital outputs DO control the operating mode (e.g., current or voltage), the range (e.g., high or low range current), and the power delivery state (e.g., on or off). The analog outputs AO may represent the desired set point current or voltage that the PPS 360 should deliver. The plating control computer 320 may have calibration tables for each channel, mode, and range of each PPS 360, which may be used to communicate the desired set point (e.g., the plating current in amps), taking into consideration the calibration results for each specific channel. The methods described may include looking up a calibration table to obtain, from the control messages received on the EtherCAT interface, a corresponding operating point for an electrical circuit that generates the output electrical control signal. A calibration table, stored either in the plating control computer 320 or in the plating subsystem 360, may be used to translate the user-programmed set point in amps or volts to corresponding operational set points for the control circuit. This translation may either happen in the plating control computer 320 where the EtherCAT interface message is a calibrated set point (DAC counts for example), or it may occur in the plating subsystem where the EtherCAT interface message is a target amps or volts.

If the PPS 360 has multiple current sensors, software running in the plating control computer 320 may determine which range should be used for each step of the process based on the desired set point and the minimum operating range of the AC-to-DC power block 432. For example, the control to route current through the high-range current sensor 441 may be selected when using the high range is appropriate, and the control input to route current through the low-range sensor 442 may be turned off.

Circuits on the control board 440 may use well-established techniques, such as proportional-integral-derivative control (PID), to drive the control pin of the AC-to-DC power block 432 to make the feedback signal match the set point signal. For example, to implement the I-term of a PID control for high range current control mode, the op amp circuit 447 may be configured to produce a control output $O2i=k_{2f}(A0-FBi)$, where $FBi=FB2i$, the high range current feedback signal from the high-range current sensor 441 and A0 is the set point signal from the plating control computer 320. If a digital output (DO) signals that voltage control mode should be used instead of current mode, $FBi=FB3i$, the voltage feedback signal FB3i from a feedback sensing circuit 450. The op amp circuit 447 can use operation amplifiers and analog multiplexers to produce the desired control signal. The first and second, or high and low range current sensors, may generate a feedback signal indicative of magnitude of the output electrical control signal during high and low range operation, respectively.

Op amp circuit 447 and op amp circuit 448 may be implemented on either side of the isolation circuit 446.

When the PPS 360 is asked to deliver current mode with currents that are below the minimum operating range of the AC-to-DC power block 432, or where the low range current control circuit is expected to provide more accurate plating results, the PPS control signal that routes current through the low-range current sensor 442 is selected, and the control signal DO2p that routes current through the high-range current sensor 441 is turned off. In this mode, two separate control loops may be used. One loop may include op amp circuit 447 that controls the AC-to-DC power block 432 to provide a fixed drain-to-source voltage (referred to as a "headroom voltage") to a low range transistor in the one or more switching elements 444. In this mode, the op amp circuit 447 may use a headroom voltage sensing circuit 449 to provide an output $O2i=k_{hrf}(k_{HRnorm}-HRi)$ control signal to the AC-to-DC power block 432. The value of $k_{HRnorm}$ may be the desired headroom voltage for normal operation of the one or more switching elements 444, and HRi may be the measured headroom voltage from the headroom voltage sensing circuit 449.

The second loop may include op amp circuit 448, which may control the low range transistor in the one or more switching elements 444, and which may act as a post-regulator for the AC-to-DC power block 432 to direct its output to a current sensor optimized for lower currents. The circuit op amp circuit 448 may use well established control techniques for control. For example, to implement the I-term of a PID control for low range current control mode, $O1i=k_{1f}(A0-FBi)$ where $FBi=FB1i$, the low range current sensor reading and A0 is the set point signal from the plating control computer 320.

The control board may contain circuitry to minimize transients when shifting between ranges. For semiconductor plating that changes rates during the plating process, processing may normally start with lower plating currents, then shift to higher plating currents later in the process. The AC-to-DC power block 432 may produce power for both ranges, but the one or more switching elements 444 may require some voltage drop ("headroom") for proper operation. By way of example, the one or more switching elements 444 may be implemented by one or more transistors, such as MOSFET transistors. Therefore, the one or more switching elements 444 may also be referred to interchangeably as a low-range transistor for purposes of this example. While operating in low range, this allows a low-range transistor in the one or more switching elements 444 to make adjustments to regulate the current at the desired value, even though the AC-to-DC power block cannot operate accurately (or at all) at the desired output.

The AC-to-DC power block 432 adjustment speed is typically slower than the one or more switching elements 444, so it is possible that when switching from low range to high range, the headroom that is desirable for low-range operation might be set such that the AC-to-DC power block 432 produces a higher current than desired for a subsequent high range step. For example, if the low range current is 2.0 amps and the high range current is 2.5 amps with a load of 1 ohm and a headroom of 3 volts, the PPS output voltage required is 2×1=2 V. The output of the AC-to-DC power block 432 to achieve a 3 V headroom would be 2V+3V=5V. If the unit switched immediately to the high range, the expected current would be 5V/1 ohm=5 A, which is higher than the desired 2.5 A set point. This would result in a current spike above the desired set point until the AC-to-DC power block 432 adjusts its output down to the level needed for the high range current step.

Many semiconductor electroplating processes are more sensitive to currents above the set point than below the set point. To reduce the potential for currents above the desired set point during the range transition, separate control DACs and circuits for high and low range current control may be used. Also, circuits to select the desired headroom for the low-range mode may be provided. The normal headroom setting $k_{HRnorm}$ provides more margin for the low range transistor to control the output. Just prior to changing to high range mode, a lower headroom setting $k_{HRmin}$ can be selected. This reduces the output of the AC-to-DC power block 432 to a minimal headroom level (reducing the margin for the low range transistor to control the output in response to load changes). Then when the PPS controller changes to high range, the system is less likely to overshoot the desired set point.

In low range mode, the low range transistors can respond more quickly to changes than the AC-to-DC power blocks. Circuits may be designed to react more quickly to the "above set point" condition than the "below set point" condition, which is often desirable both from the process standpoint, and also to protect the low-range transistor from damage due to power dissipation limits. Additionally, the I term (integral term) of the control circuit response speed automatically slows when headroom drops below a threshold level. This allows fast response when sufficient headroom is available, but slows the response down to follow the AC-to-DC power block response when there is insufficient headroom. This may prevent accumulating the I-term in the low range control circuit and the subsequent overshoot that would result without this feature.

Power-Based Headroom Voltage

Maintaining the headroom voltage on the low-range transistor as described above allows the circuit to respond to changes in the voltage profile across the load. For example, if a voltage profile across the load begins at 2 V and ramps up to 7 V, maintaining a sufficient headroom voltage on the low-range transistor allows the circuit to respond by allowing the voltage on the load to increase faster than would normally be possible because of the extra voltage maintained in the headroom of the low-range transistor. Therefore, the headroom voltage provides the benefit of allowing the voltage response curve to ramp up quickly.

If maintaining extra voltage in the headroom of the low-range transistor were the only concern, the AC-to-DC power block 432 could simply set the voltage across the low-range transistor 444 to a maximum value (e.g., 24 V), which would allow the voltage on the load to ramp up quickly to any voltage level in that range. However, running the low-range transistor 444 at a very high voltage necessarily generates a large amount of power dissipated in the low-range transistor 444. For example, as current through the low-range transistor 444 begins to increase, the power dissipated by the low-range transistor 444 may be defined as the instantaneous current multiplied by the instantaneous voltage. When the headroom voltage on the low-range transistor 444 is constantly maximized, the resulting power dissipated by the low-range transistor 444 may be very high as the current increases. This power may be dissipated as heat in the control board 440. The heat dissipated by the low-range transistor 444 may damage the low-range transistor 444, the printed circuit board, and/or other nearby components when the headroom voltage is unnecessarily high.

In some implementations, the headroom voltage maintained on the low-range transistor is maintained at a constant level above the operating voltage on the load. For example, some implementations may program the AC-to-DC power block 432 to maintain a headroom voltage of at least 3 V above the load voltage on the low-range transistor 444. If the voltage on the load was 2 V, the voltage of the transistor would be maintained at approximately 5 V to maintain a constant headroom voltage of 3 V. If the load voltage ramped up from 2 V to 5 V, the 3 V headroom voltage would be sufficient to allow the voltage to increase without lagging behind for rise times on the order of 100 ms. By maintaining this minimum, constant headroom voltage, the power dissipated by the low-range transistor 444 could be minimized while still providing enough headroom for slow voltage increases across the load.

Although maintaining a constant headroom voltage decreases the power dissipated in the low-range transistor 444, it often does not provide enough headroom voltage to support rapid increases in the voltage profile across the load. For example, rise times significantly less than 100 ms could not be supported by the fixed headroom voltage described above. The output of the low-range transistor 444 would lag behind the desired voltage profile curve on the output, resulting in discontinuities in the output curve. Thus, it is difficult to support rapid rise times on the order of 1 ms while maintaining a constant headroom voltage.

To overcome this technical challenge, the embodiments described herein maintain a constant power dissipation in the low-range transistor. The current running through the low-range transistor and the voltage across the low-range transistor can be monitored in real time and multiplied to generate an instantaneous power dissipation in the low-range transistor. This power dissipation may be provided to a voltage difference amplifier that is used as a feedback input to an adjustable voltage source. Instead of maintaining a constant headroom voltage, the headroom voltage may change dynamically as the current through the low-range transistor changes. For example, at very low currents, a very high headroom voltage may be maintained because the product of these two terms will result in a relatively low power dissipation. As the current begins to ramp up, the headroom voltage may decrease to maintain this constant power dissipation. This solution provides rise times on the order of 1 ms, as the initial voltage headroom is large enough to support rapid initial rises in the output voltage on the load.

Figure 5:
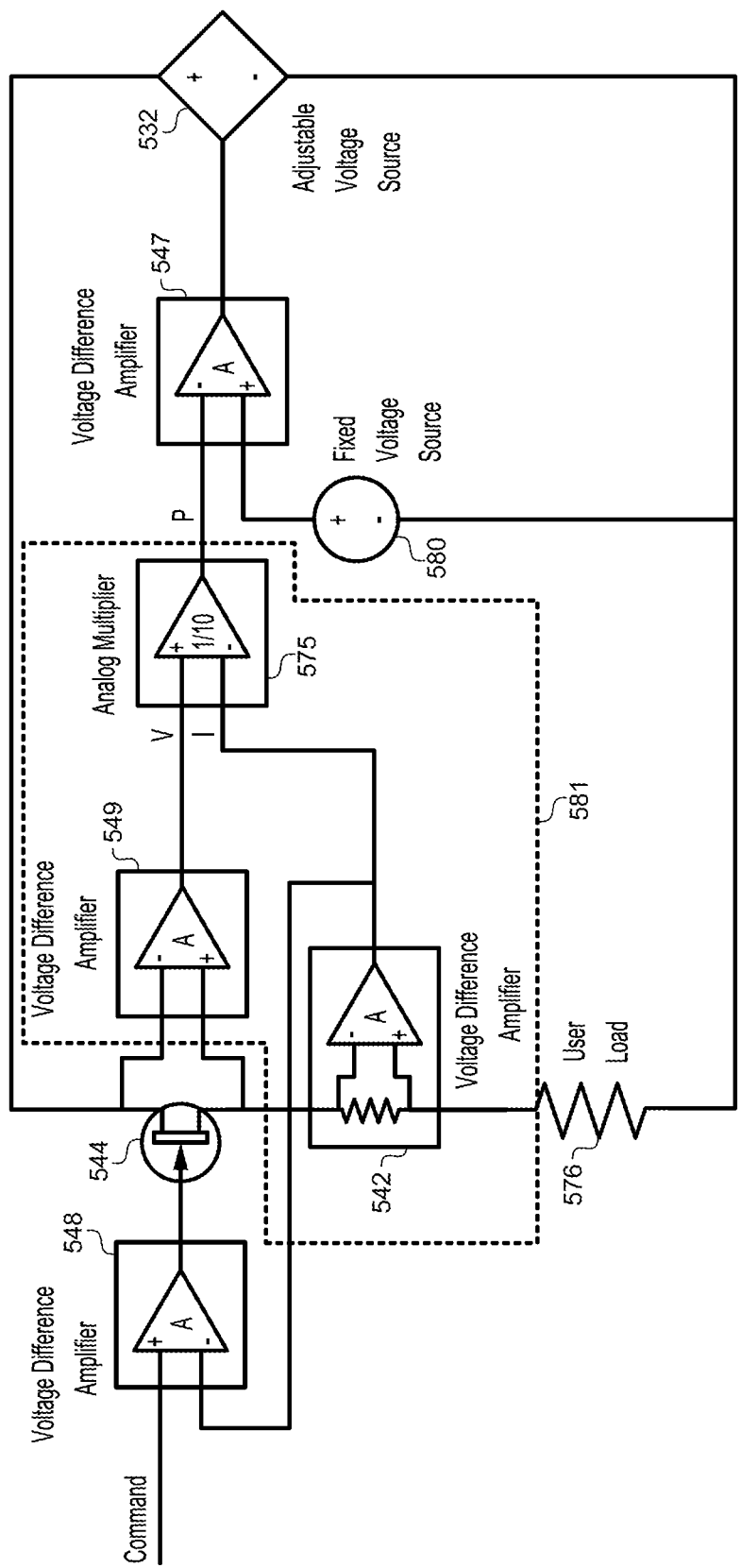
FIG. 5 illustrates a circuit for maintaining a power-regulated headroom voltage, according to some embodiments.

FIG. 5 illustrates a circuit for maintaining a power-regulated headroom voltage, according to some embodiments. This circuit may operate as a standalone circuit in many different applications to regulate a headroom voltage across a transistor or switching stage to maintain a constant power dissipated in that transistor stage. In one specific implementation, certain elements of this circuit depicted in FIG. 5 may be used to implement circuit elements of the control board 440 illustrated in FIG. 4. The circuit may include a transistor stage 544, and the one or more switching elements 444 in FIG. 4 may be implemented using one or more transistors in the transistor stage 544. By way of example, the transistor stage 544 may be implemented using one or more transistors such as the IRFP3810 series Power MOSFET from International Rectifier®. The circuit in FIG. 5 may be configured to monitor a headroom voltage maintained on this transistor stage 544.

A voltage measurement circuit may be provided to measure a voltage across the transistor stage 544. In some embodiments, the voltage measurement circuit may be implemented using a voltage difference amplifier 549 to measure a voltage across the transistor stage 544. For example, the voltage difference amplifier 549 may receive two inputs, with a first input coupled to a drain of a final transistor in the transistor stage 544, and a second input coupled to an initial source of the transistor stage 544. The output of the voltage difference amplifier 549 may be a scaled value that is proportional to a voltage difference across the transistor stage 544 and thus represents the voltage across the transistor stage 544.

Figure 6:
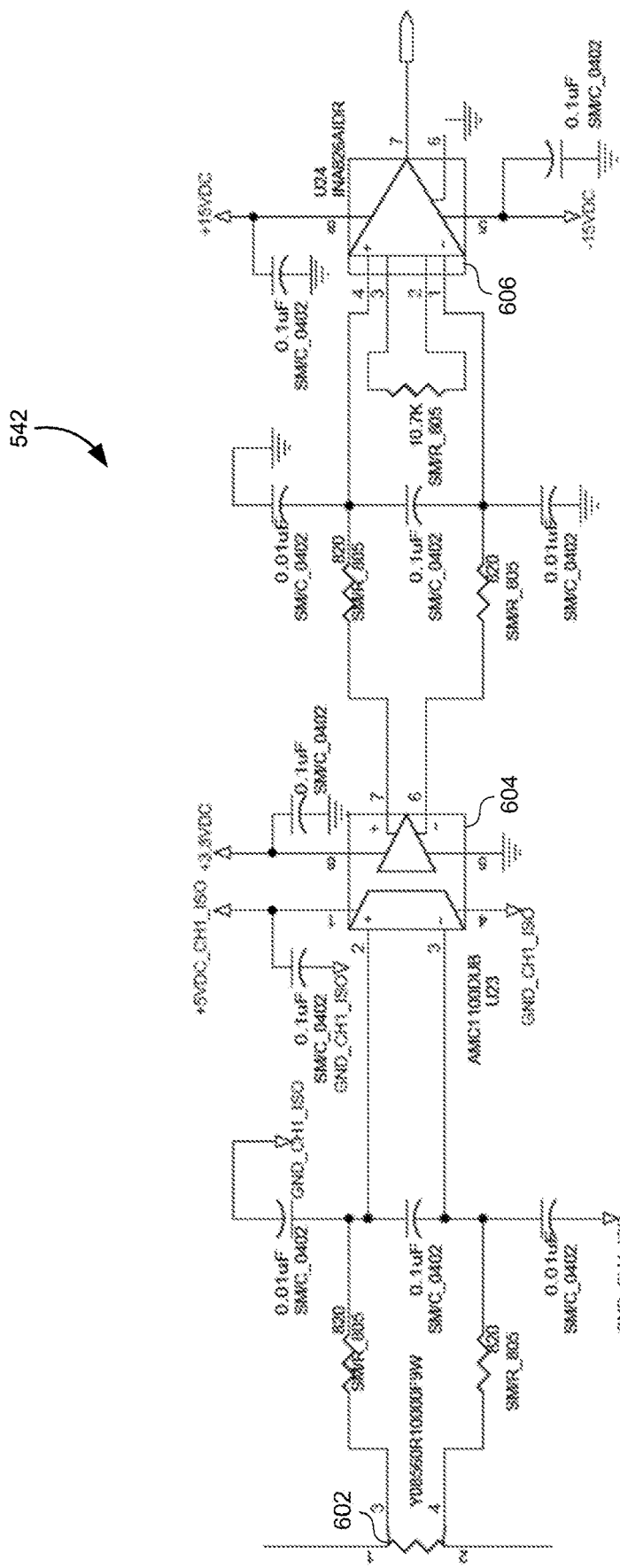
FIG. 6 illustrates an example circuit diagram of the voltage difference amplifier configured to generate a voltage representing the current through the transistor stage, according to some embodiments.

In addition to measuring the voltage across the transistor stage 544, the circuit may include a current measurement circuit that measures a current through the transistor stage 544. The current measurement circuit may be implemented using a voltage difference amplifier 542 configured to generate a voltage proportional to a current running through the transistor stage 544. FIG. 6 illustrates an example circuit diagram of the voltage difference amplifier 542 configured to generate a voltage representing the current through the transistor stage 544, according to some embodiments. A relatively small resistor 602 may be placed in series with the transistor stage 544. The value of the resistor may be approximately 0.1 ohms in the example embodiment of FIG. 6, and may be implemented by the Y08560R10000F9 W Foil® resistor from Vishay. To measure the voltage across the resistor 602, this example uses an amplifier 604, such as the AMC1100 amplifier for current sensing from Texas Instruments®, along with an instrumentation amplifier such as the INA826 from Texas Instruments®. Note that these components and component values are provided only by way of example and are not meant to be limiting. Many other implementations of a current measurement circuit may be used with different components. The example of FIG. 6 is illustrated only to provide an enabling disclosure, and it represents only one of many possible embodiments that fall within the scope of this disclosure. Also note that a similar circuit may be used for each of the voltage difference amplifiers illustrated in FIG. 5. For example, each of the voltage difference amplifiers 542 and 549 may be implemented using a circuit similar to that shown in FIG. 6, with different inputs and component values. For brevity, the circuit of FIG. 6 is not repeated herein for each of these voltage difference amplifier implementations in FIG. 5.

Turning back to FIG. 5, with the output of the voltage difference amplifier 549 representing an instantaneous voltage across the transistor stage 544, and the voltage output of the voltage difference amplifier 542 representing an instantaneous current running through the transistor stage 544, the two components of a standard power measurement are now available in the circuit. The voltage and current measurements may be provided to a multiplier circuit that generates a product of these two inputs. In this particular example, the multiplier circuit may be implemented by an analog multiplier 575. The analog multiplier 575 may be implemented using a component such as the AD633 analog multiplier from Analog Devices®. This device may allow the output to be scaled down by a factor of 10 to keep the output product within an operating voltage range of the device. The output may be a signal that is representative of an instantaneous power dissipation in the transistor stage 544.

As used herein, a signal may be "representative" of a voltage, current, power, or other electrical characteristic of the circuit when that signal is directly or inversely proportional or can otherwise be translated into the voltage, current, power, or other electoral characteristic in question. For example, the scaled voltage output of the analog multiplier 575 may be a voltage that can be translated into an instantaneous power dissipation. In another example, an output of the voltage difference amplifier 549 may be representative of a voltage across the transistor stage 544. Even though the output of the voltage difference amplifier 549 will not be the exact voltage across the transistor stage 544, it may be proportional to that voltage. Similarly, the output of the voltage difference amplifier 542 may be representative of the current through the transistor stage 544 as a voltage proportional to that current.

The voltage difference amplifiers 542, 549 that measure the instantaneous voltage and current of the transistor stage 544, along with the analog multiplier 575 may be referred to collectively as a power-measurement circuit 581. However, the circuit elements illustrated in FIG. 5 and FIG. 6 for implementing the power-measurement circuit 581 are provided only by way of example and are not meant to be limiting. Many other types of analog/digital circuits may be used to measure the instantaneous power dissipation in the transistor stage 544. For example, a microcontroller or microprocessor may receive analog voltage/current signals from the transistor stage 544 and convert those signals into digital values. The microcontroller or microprocessor may then generate an output signal to control the adjustable voltage source 532. In another example, a power-measurement integrated circuit may receive voltage and/or current signals from the transistor stage 544 and may output a signal that may be used to directly control the adjustable voltage source 532. Other methods of implementing the power-measurement circuit 581 also fall within the scope of this disclosure.

As used herein, the term "coupled to" may describe circuit elements that send and receive electrical signals to/from each other. Two components may be electrically coupled when a signal based on an output of one component is provided as an input to another component. For example, the voltage difference amplifier 549 is coupled to the transistor stage 544 by receiving voltage signals from the transistor stage 544. Similarly, the voltage difference amplifier 542 is coupled to the transistor stage 544 by receiving a current signal output from the transistor stage 544. Note that two components may be coupled together through additional components. For example, the voltage difference amplifier 549 is coupled to the voltage difference amplifier 547, even though the analog multiplier 575 processes the signal between these two components.

The output of the analog multiplier 575 may be provided to a difference circuit that calculates a difference between two signals. The difference circuit may be implemented using another voltage difference amplifier 547. The other input of the voltage difference amplifier 547 may receive a fixed voltage source 580. The fixed voltage source 580 may represent a target power dissipation to be maintained in the transistor stage 544. The target power dissipation may be represented as a voltage that is scaled to be commensurate with the scaled output of the analog multiplier 575. In the example of FIG. 4, the voltage difference amplifier 547 may represent the op amp circuit 447 that provides a control signal to the AC-to-DC power block 432, which may implement the adjustable voltage source 532 in FIG. 5. The output of the voltage difference amplifier 547 may provide an error signal that is translated into an output DC voltage across the transistor stage 544 and the load 576. The voltage difference amplifier 547 may be implemented using a component such as the LM358 operational amplifier from Texas Instruments®. The fixed voltage source 580 may be implemented using any type of voltage source, such as series resistors acting as a voltage divider from a known reference or rail voltage. In some embodiments, the voltage source 580 may be dynamically programmable by software in the system, such that the power dissipated by the transistor stage 544 can be set to any value.

The gate voltage applied to the transistor stage 544 may be received from a voltage difference amplifier 548. The voltage difference amplifier 548 may receive a command from the I/O interface 445 representing a target current through the load 576. The instantaneous current measurement received from the voltage difference amplifier 542 may be provided to a voltage difference amplifier 548, the output of which may provide a gate voltage for the transistor stage 544. Adjusting the gate voltage on the transistor stage 544 may regulate the amount of current running through the transistor stage 544 until it matches the target current value in the command. In the example of FIG. 4, the load 576 may represent the plating chamber described above.

Figure 7:
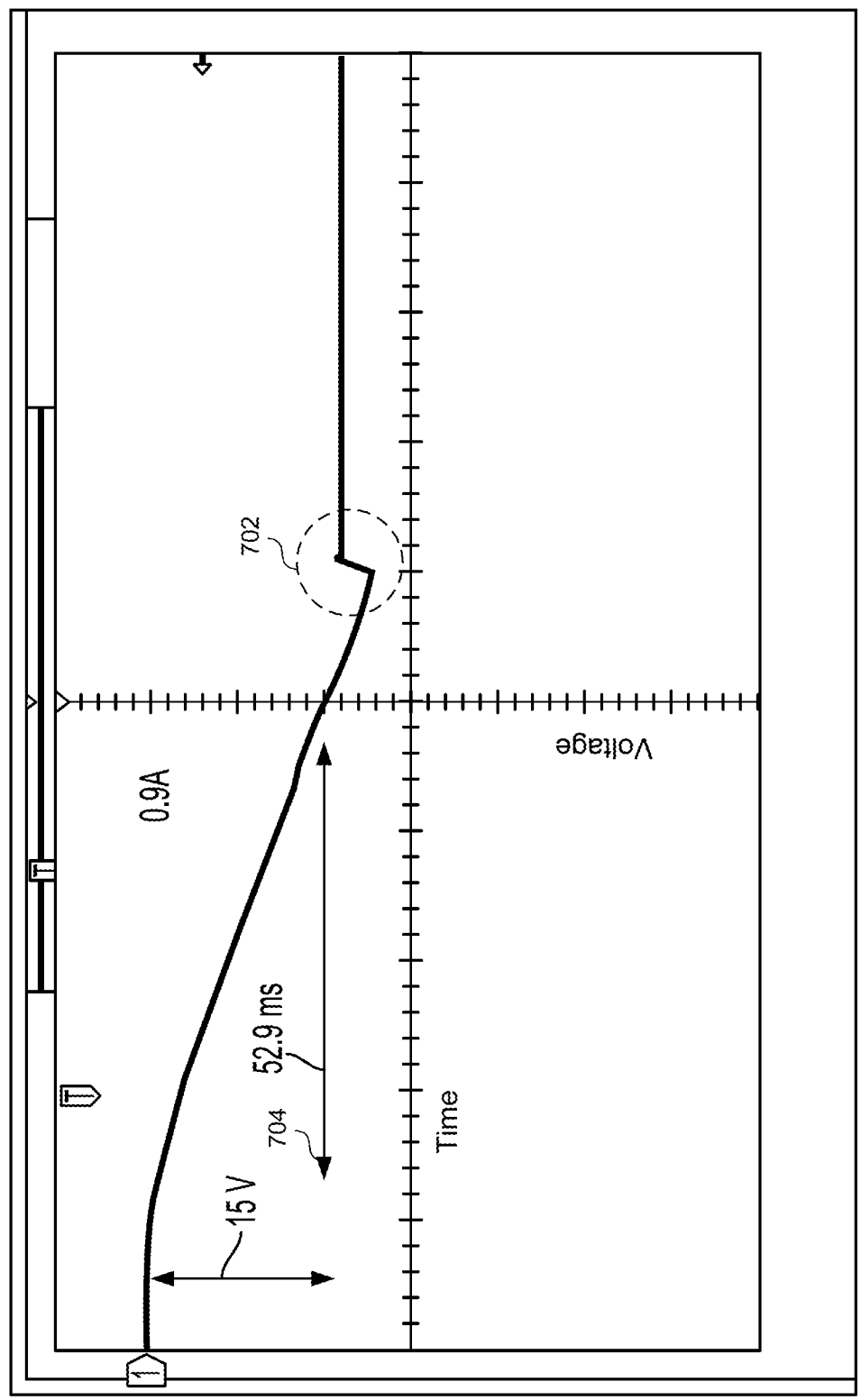
FIG. 7 illustrates an example of the fall time associated with a constant voltage headroom control system, according to some embodiments.

FIG. 7 illustrates an example of the fall time associated with a constant voltage headroom control system, according to some embodiments. In this example, the headroom of the voltage on the transistor may be maintained at a constant value as described in the previous implementations above. When dropping approximately 15 V at 0.9 A, the fall time 704 on the measurement is approximately 52.9 ms. Additionally, the drop in voltage generates a significant overshoot 702. The discontinuity of the overshoot 702 can lead to anomalous effects in the electroplating process.

Figure 8:
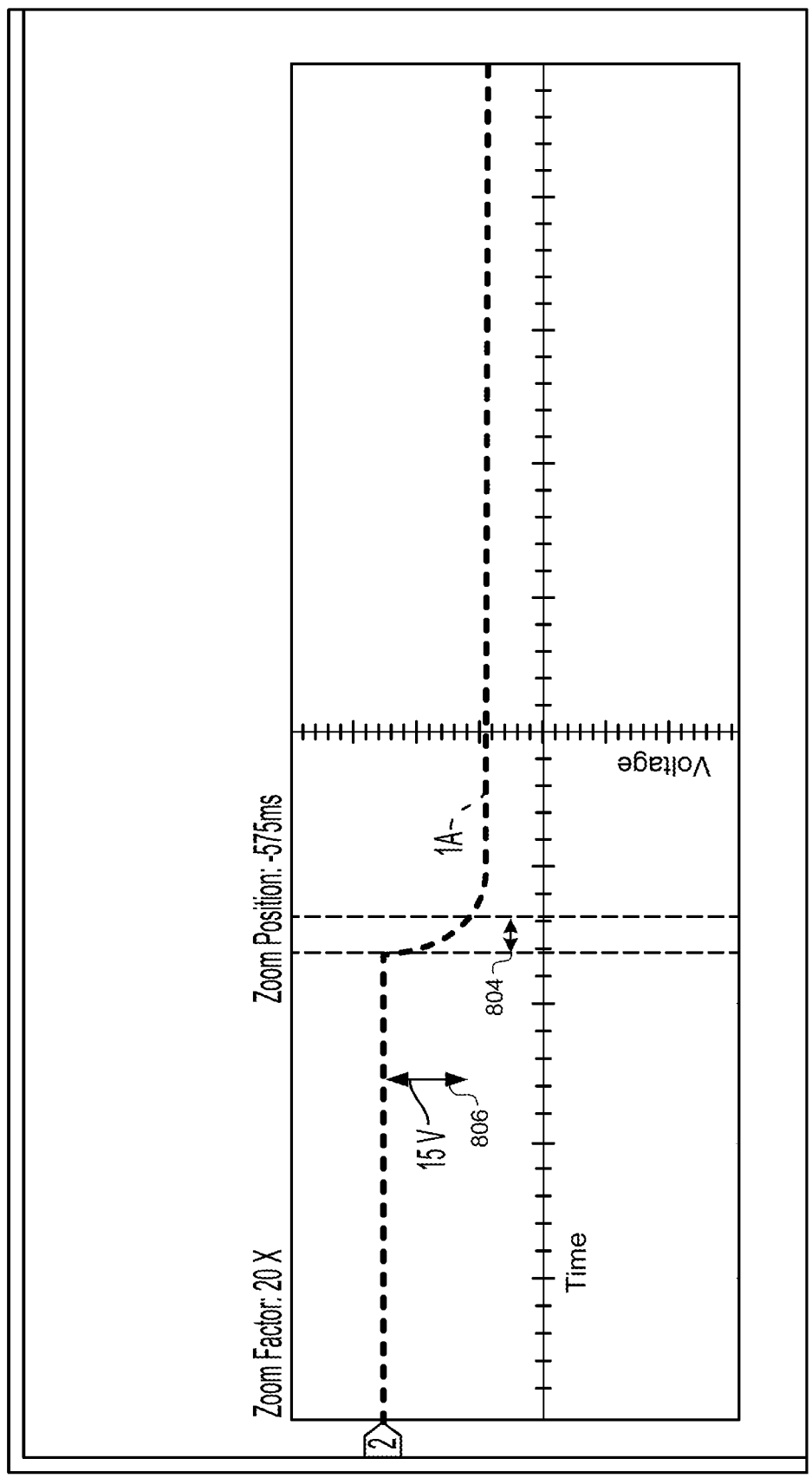
FIG. 8 illustrates an example of the fall time associated with a variable voltage headroom that maintains a constant power dissipation, according to some embodiments.

FIG. 8 illustrates an example of the fall time associated with a variable voltage headroom that maintains a constant power dissipation, according to some embodiments. In this example, the headroom voltage of the transistor is maintained at a constant power dissipation using the circuit described above in FIG. 5. In this case, when dropping approximately 15 V at 1.0 A, the fall time 804 is approximately 2.5 ms. Notably, this faster voltage drop results in almost no significant overshoot. Therefore, the constant power dissipation provided by the circuit of FIG. 5 may effectively reduce discontinuities in the electroplating process for rapid rise/fall times.

Figure 9:
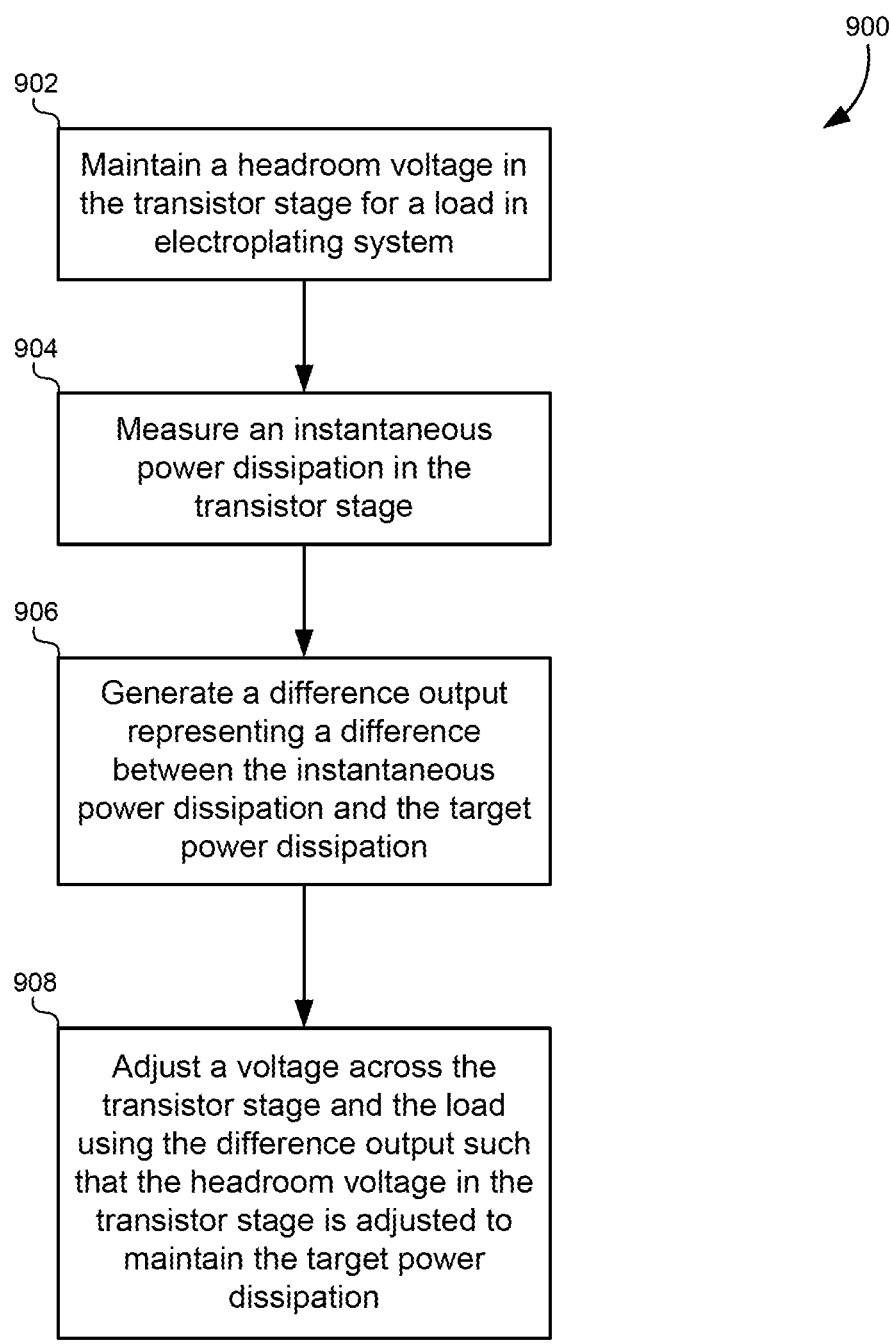
FIG. 9 illustrates a method of regulating a headroom voltage for constant power dissipation, according to some embodiments.

FIG. 9 illustrates a method 900 of regulating a headroom voltage for constant power dissipation, according to some embodiments. The method may include maintaining a headroom voltage in a transistor stage for a load in an electroplating system (902). As described above, the transistor stage may include one or more switching elements, such as MOSFET transistors in series and/or in parallel. The load may represent a voltage/current provided to the electroplating system to add a layer of metal to a substrate or wafer. The headroom voltage may represent a voltage across the transistor stage maintained at a voltage above the voltage across the load. The headroom voltage may be maintained in order to allow the voltage across the load to ramp up/down quickly with a minimal rise time and/or fall time.

The method may also include measuring an instantaneous power dissipation in the transistor stage (904). The instantaneous power dissipation in the transistor stage may be measured using a power-measurement circuit as described in detail above in FIG. 5 and FIG. 6. For example, the instantaneous power dissipation may be measured by measuring a voltage across the transistor stage, measuring a current through the transistor stage, and multiplying these values together to generate a signal representative of the instantaneous power dissipation in the transistor stage. This signal may be a scaled voltage that may be mathematically translated into a value for the dissipated power. The instantaneous power dissipation may be measured/calculated using individual IC components, discrete board-level components, a microprocessor or microcontroller, and/or using other methods.

The method may additionally include generating a difference output representing a difference between the instantaneous power dissipation in the transistor stage and the target power dissipation in the transistor stage (906). The different signal may be generated by a voltage difference amplifier as described above in FIG. 5. The target power dissipation may be represented by a fixed voltage source that may be compared to the signal representing the instantaneous power dissipation. The target power dissipation may also be provided as a programmable input such that the instantaneous power dissipation may be changed at runtime.

The method may further include adjusting a voltage across the transistor stage and the load using the difference output, such that the headroom voltage in the transistor stage is adjusted to maintain the target power dissipation in the transistor stage (908). The voltage may be adjusted by providing the difference output to a programmable AC-to-DC converter that generates a DC output across the load and the transistor stage as described above.

It should be appreciated that the specific steps illustrated in FIG. 9 provide particular methods of controlling a headroom voltage of a transistor stage of an electroplating system to maintain a target power dissipation, according to various embodiments. Other sequences of steps may also be performed according to alternative embodiments. For example, alternative embodiments may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 10:
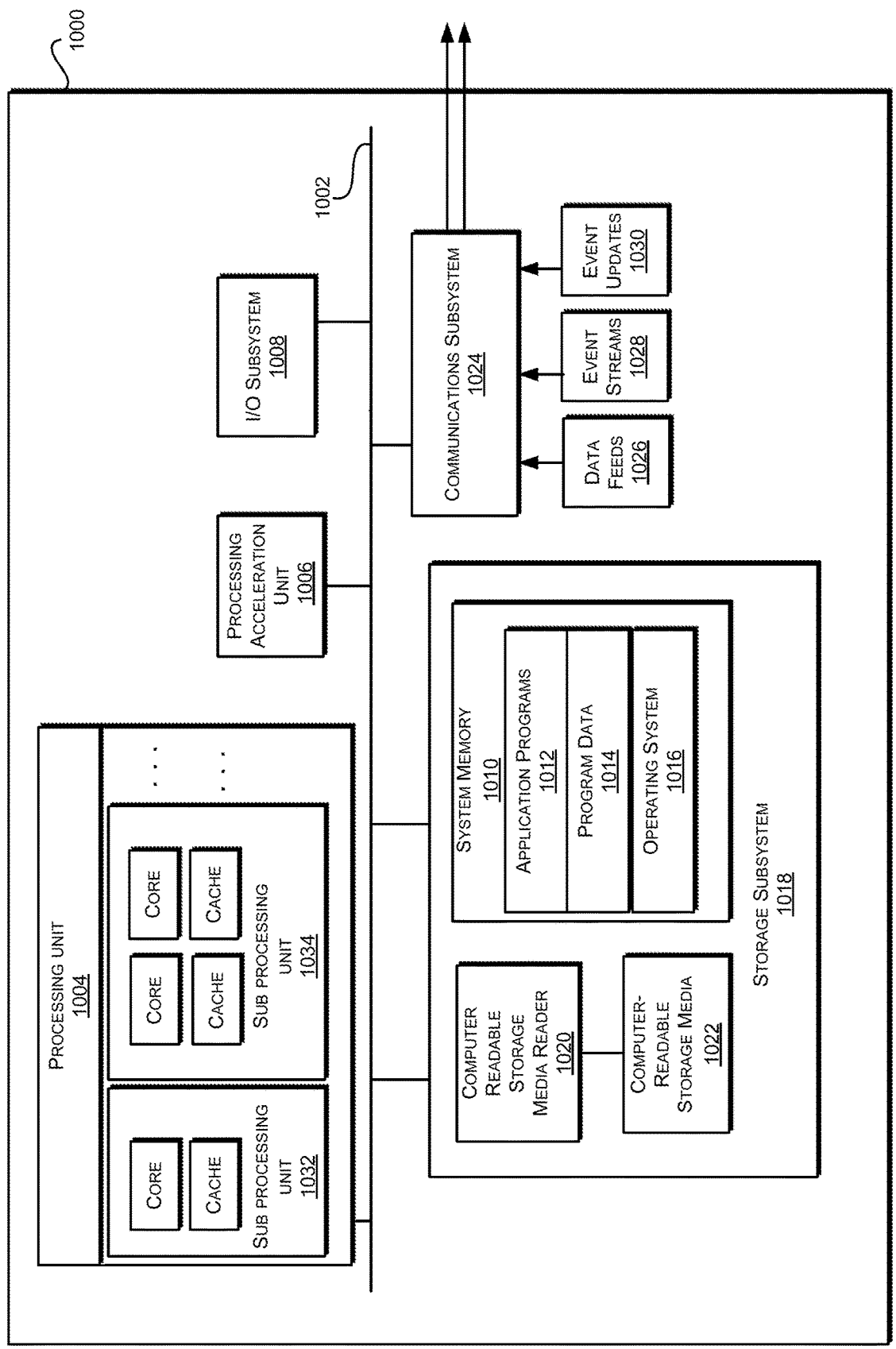
FIG. 10 illustrates an exemplary computer system, in which various embodiments may be implemented.

Various components of the system described above may be implemented by a computing system, including the user interface computer 312 and/or the plating control computer 320. FIG. 10 illustrates an exemplary computer system 1000, in which various components may be implemented. The system 1000 may be used to implement any of the computer systems described above. As shown in the figure, computer system 1000 includes a processing unit 1004 that communicates with a number of peripheral subsystems via a bus subsystem 1002. These peripheral subsystems may include a processing acceleration unit 1006, an I/O subsystem 1008, a storage subsystem 1018 and a communications subsystem 1024. Storage subsystem 1018 includes tangible computer-readable storage media 1022 and a system memory 1010.

Bus subsystem 1002 provides a mechanism for letting the various components and subsystems of computer system 1000 communicate with each other as intended. Although bus subsystem 1002 is shown schematically as a single bus, alternative embodiments of the bus subsystem may utilize multiple buses. Bus subsystem 1002 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1004, which can be implemented as one or more integrated circuits (e.g., a conventional microprocessor or microcontroller), controls the operation of computer system 1000. One or more processors may be included in processing unit 1004. These processors may include single core or multicore processors. In certain embodiments, processing unit 1004 may be implemented as one or more independent processing units 1032 and/or 1034 with single or multicore processors included in each processing unit. In other embodiments, processing unit 1004 may also be implemented as a quad-core processing unit formed by integrating two dual-core processors into a single chip.

In various embodiments, processing unit 1004 can execute a variety of programs in response to program code and can maintain multiple concurrently executing programs or processes. At any given time, some or all of the program code to be executed can be resident in processor(s) 1004 and/or in storage subsystem 1018. Through suitable programming, processor(s) 1004 can provide various functionalities described above. Computer system 1000 may additionally include a processing acceleration unit 1006, which can include a digital signal processor (DSP), a special-purpose processor, and/or the like.

I/O subsystem 1008 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1000 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1000 may comprise a storage subsystem 1018 that comprises software elements, shown as being currently located within a system memory 1010. System memory 1010 may store program instructions that are loadable and executable on processing unit 1004, as well as data generated during the execution of these programs.

Depending on the configuration and type of computer system 1000, system memory 1010 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1004. In some implementations, system memory 1010 may include multiple different types of memory, such as static random access memory (SRAM) or dynamic random access memory (DRAM). In some implementations, a basic input/output system (BIOS), containing the basic routines that help to transfer information between elements within computer system 1000, such as during start-up, may typically be stored in the ROM. By way of example, and not limitation, system memory 1010 also illustrates application programs 1012, which may include client applications, Web browsers, mid-tier applications, relational database management systems (RDBMS), etc., program data 1014, and an operating system 1016. By way of example, operating system 1016 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1018 may also provide a tangible computer-readable storage medium for storing the basic programming and data constructs that provide the functionality of some embodiments. Software (programs, code modules, instructions) that when executed by a processor provide the functionality described above may be stored in storage subsystem 1018. These software modules or instructions may be executed by processing unit 1004. Storage subsystem 1018 may also provide a repository for storing data used in accordance with some embodiments.

Storage subsystem 1000 may also include a computer-readable storage media reader 1020 that can further be connected to computer-readable storage media 1022. Together and, optionally, in combination with system memory 1010, computer-readable storage media 1022 may comprehensively represent remote, local, fixed, and/or removable storage devices plus storage media for temporarily and/or more permanently containing, storing, transmitting, and retrieving computer-readable information.

Computer-readable storage media 1022 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1000.

By way of example, computer-readable storage media 1022 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1022 may include, but is not limited to, Zip® drives, flash memory cards, universal serial bus (USB) flash drives, secure digital (SD) cards, DVD disks, digital video tape, and the like. Computer-readable storage media 1022 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1000.

Communications subsystem 1024 provides an interface to other computer systems and networks. Communications subsystem 1024 serves as an interface for receiving data from and transmitting data to other systems from computer system 1000. For example, communications subsystem 1024 may enable computer system 1000 to connect to one or more devices via the Internet. In some embodiments communications subsystem 1024 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1024 can provide wired network connectivity (e.g., Ethernet) in addition to or instead of a wireless interface.

In some embodiments, communications subsystem 1024 may also receive input communication in the form of structured and/or unstructured data feeds 1026, event streams 1028, event updates 1030, and the like on behalf of one or more users who may use computer system 1000.

By way of example, communications subsystem 1024 may be configured to receive data feeds 1026 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1024 may also be configured to receive data in the form of continuous data streams, which may include event streams 1028 of real-time events and/or event updates 1030, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1024 may also be configured to output the structured and/or unstructured data feeds 1026, event streams 1028, event updates 1030, and the like to one or more databases that may be in communication with one or more streaming data source computers coupled to computer system 1000.

Computer system 1000 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, the term "approximately" may be interpreted to mean within 10% of a stated value. For example, approximately 10.0 V may be interpreted as a range of between 9.0 V and 11.0 V. The term "substantially" may be interpreted to mean at least approximately 90% of a value. For example, substantially filling an area may be interpreted as filling approximately 90% of an area.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A circuit for controlling a headroom voltage of a transistor stage of an electroplating system to maintain a target power dissipation across the transistor stage, the circuit comprising:
   a transistor stage, wherein the transistor stage provides a headroom voltage for a load in an electroplating system;
   a difference amplifier that receives a signal representing a target current through the transistor stage and receives an instantaneous current through the transistor stage, wherein the difference amplifier provides a gate voltage to the transistor stage to achieve the target current through the transistor stage;
   a power-measurement circuit coupled to the transistor stage, wherein the power-measurement circuit provides a signal representative of an instantaneous power dissipation in the transistor stage;
   a difference circuit that receives the signal representative of the instantaneous power dissipation in the transistor stage from the power-measurement circuit and receives a signal representative of the target power dissipation in the transistor stage to generate a difference output; and
   an adjustable voltage source that provides a voltage across the transistor stage and the load, wherein the adjustable voltage source is configured to use the difference output to adjust the headroom voltage to maintain the target power dissipation in the transistor stage.

2. The circuit of claim 1, wherein the power-measurement circuit comprises:
   a voltage measurement circuit coupled to the transistor stage to provide a measurement representing a voltage across the transistor stage.

3. The circuit of claim 2, wherein the power-measurement circuit further comprises:
   a current measurement circuit coupled to the transistor stage to provide a measurement representing a current through the transistor stage.

4. The circuit of claim 3, wherein the power-measurement circuit further comprises:
   a multiplier circuit that receives the measurement representing the voltage across the transistor stage and the measurement representing the current through the transistor stage to generate the signal representative of an instantaneous power dissipation in the transistor stage.

5. The circuit of claim 1, wherein the difference circuit comprises an operational amplifier that provides an output to an AC-to-DC converter.

6. The circuit of claim 1, wherein the signal representative of the instantaneous power dissipation in the transistor stage comprises a voltage that is proportional to the instantaneous power dissipation.

7. The circuit of claim 1, wherein the power-measurement circuit is implemented using a microprocessor or microcontroller.

8. The circuit of claim 1, wherein the power-measurement circuit multiplies a signal representative of a voltage across the transistor stage with a signal representative of a current through the transistor stage to determine the instantaneous power dissipation in the transistor stage.

9. A method of controlling a headroom voltage of a transistor stage of an electroplating system to maintain a target power dissipation across the transistor stage, the method comprising:
   maintaining a headroom voltage in the transistor stage for a load in the electroplating system;
   multiplying a signal representative of a voltage across the transistor stage with a signal representative of a current through the transistor stage to determine the instantaneous power dissipation in the transistor stage;
   generating a difference output representing a difference between the instantaneous power dissipation in the transistor stage and the target power dissipation in the transistor stage; and
   adjusting a voltage across the transistor stage and the load using the difference output such that the headroom voltage in the transistor stage is adjusted to maintain the target power dissipation in the transistor stage.

10. The method of claim 9, further comprising determining a voltage across the transistor stage.

11. The method of claim 9, further comprising determining a current through the transistor stage.

12. The method of claim 9, further comprising reducing the headroom voltage in the transistor stage as a current through the transistor stage increases.

13. The method of claim 9, further comprising scaling down a signal representative of the instantaneous power dissipation in the transistor stage.

14. The method of claim 9, further comprising generating a transition in the voltage across the transistor stage and the load having less than a 10 ms fall time.

15. The method of claim 9, further comprising:
   receiving a signal representing a target current though the transistor stage;
   receiving an instantaneous current through the transistor stage;
   calculating a difference between the target current and the instantaneous current; and
   providing a gate voltage to the transistor stage to achieve the target current through the transistor stage.

16. A circuit for controlling a headroom voltage of a transistor stage to maintain a target power dissipation across the transistor stage, the circuit comprising:
   a transistor stage, wherein the transistor stage provides a headroom voltage for a load;
   a microprocessor or microcontroller coupled to the transistor stage, wherein the microprocessor or microcontroller provides a signal representative of an instantaneous power dissipation in the transistor stage; and
   an adjustable voltage source that provides a voltage across the transistor stage and a load, wherein the adjustable voltage source is configured to adjust the headroom voltage in the transistor stage in response to the instantaneous power dissipation in the transistor stage to maintain the target power dissipation in the transistor stage.

17. The circuit of claim 16, wherein the target power dissipation is represented by a plurality of series resistors forming a voltage divider.

18. The circuit of claim 16, wherein the adjustable voltage source comprises a AC-to-DC power converter.

19. The circuit of claim 16, further comprising a serial interface that receives serial commands from a controller and translates the serial commands into a plurality of analog and digital signals to control the circuit for controlling the headroom voltage of the transistor stage.

20. The circuit of claim 16, further comprising a difference amplifier that receives a signal representing a target current though the transistor stage and receives an instantaneous current through the transistor stage, wherein the difference amplifier provides a gate voltage to the transistor stage to achieve the target current through the transistor stage.

* * * * *